(12) United States Patent
Shigaki et al.

(10) Patent No.: US 9,337,052 B2
(45) Date of Patent: May 10, 2016

(54) SILICON-CONTAINING EUV RESIST UNDERLAYER FILM FORMING COMPOSITION

(71) Applicant: NISSAN CHEMICAL INDUSTRIES, LTD., Tokyo (JP)

(72) Inventors: Shuhei Shigaki, Toyama (JP); Hiroaki Yaguchi, Toyama (JP); Rikimaru Sakamoto, Toyama (JP); Bang-ching Ho, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/350,202

(22) PCT Filed: Oct. 2, 2012

(86) PCT No.: PCT/JP2012/075507
§ 371 (c)(1),
(2) Date: Apr. 7, 2014

(87) PCT Pub. No.: WO2013/051558
PCT Pub. Date: Apr. 11, 2013

(65) Prior Publication Data
US 2014/0232018 A1  Aug. 21, 2014

(30) Foreign Application Priority Data
Oct. 6, 2011 (JP) ................................ 2011-222120

(51) Int. Cl.
| | | |
|---|---|---|
| H01L 21/311 | (2006.01) |
| H01L 21/02 | (2006.01) |
| B05D 3/02 | (2006.01) |
| G03F 7/38 | (2006.01) |
| G03F 7/40 | (2006.01) |
| G03F 7/20 | (2006.01) |
| G03F 7/11 | (2006.01) |
| G03F 7/075 | (2006.01) |
| H01L 21/308 | (2006.01) |
| C09D 183/04 | (2006.01) |
| C09D 183/08 | (2006.01) |
| C08G 77/24 | (2006.01) |
| C08G 77/26 | (2006.01) |
| C08G 77/00 | (2006.01) |

(52) U.S. Cl.
CPC ............ *H01L 21/311* (2013.01); *B05D 3/0272* (2013.01); *C09D 183/04* (2013.01); *C09D 183/08* (2013.01); *G03F 7/0752* (2013.01); *G03F 7/11* (2013.01); *G03F 7/2004* (2013.01); *G03F 7/38* (2013.01); *G03F 7/40* (2013.01); *H01L 21/02107* (2013.01); *H01L 21/02112* (2013.01); *H01L 21/02123* (2013.01); *H01L 21/02137* (2013.01); *H01L 21/3081* (2013.01); *C08G 77/24* (2013.01); *C08G 77/26* (2013.01); *C08G 77/80* (2013.01)

(58) Field of Classification Search
None
See application file for complete search history.

(56) References Cited

U.S. PATENT DOCUMENTS

2010/0285407 A1* 11/2010 Ogihara et al. ............ 430/272.1
2010/0330505 A1   12/2010 Nakajima et al.

FOREIGN PATENT DOCUMENTS

| | | |
|---|---|---|
| EP | 2249204 A1 | 11/2010 |
| JP | A-2005-48152 | 2/2005 |
| JP | A-2008-76889 | 4/2008 |
| JP | A-2008-309929 | 12/2008 |
| JP | A-2009-103831 | 5/2009 |
| JP | A-2010-85878 | 4/2010 |
| JP | A-2010-519596 | 6/2010 |
| JP | A-2010-237667 | 10/2010 |
| WO | WO 2008/106379 A1 | 9/2008 |
| WO | WO 2009/104552 A1 | 8/2009 |
| WO | 2011/033965 A1 | 3/2011 |
| WO | 2011/102470 A1 | 8/2011 |

OTHER PUBLICATIONS

Written Opinion issued in International Patent Application No. PCT/JP2012/075507 dated Oct. 30, 2012.
International Search Report issued in International Patent Application No. PCT/JP2012/075507 dated Oct. 30, 2014 (with translation).
Apr. 28, 2015 Extended European Search Report issued in European Patent Application No. 12 838 943.4.

* cited by examiner

*Primary Examiner* — Marc Zimmer
(74) *Attorney, Agent, or Firm* — Oliff PLC

(57) ABSTRACT

A resist underlayer film forming composition for EUV lithography, comprising: as a silane, a hydrolyzable silane, a hydrolyzate of the hydrolyzable silane, a hydrolysis condensate of the hydrolyzable silane, or a mixture of any of the hydrolyzable silane, the hydrolyzate, and the hydrolysis condensate, wherein the hydrolyzable silane includes a combination of tetramethoxysilane, an alkyltrimethoxysilane, and an aryltrialkoxysilane, and the aryltrialkoxysilane is represented by formula (1):

$$(R^2)_{n2}-R^1-(CH_2)_{n1}-Si(X)_3 \qquad \text{Formula (1)}$$

In formula (1), $R^1$ is an aromatic ring consisting of a benzene ring or a naphthalene ring or a ring including an isocyanuric acid structure, $R^2$ is a substituent replacing a hydrogen atom on the aromatic ring and is a halogen atom or a $C_{1-10}$ alkoxy group, and X is a $C_{1-10}$ alkoxy group, a $C_{2-10}$ acyloxy group, or a halogen group.

13 Claims, No Drawings

US 9,337,052 B2

SILICON-CONTAINING EUV RESIST UNDERLAYER FILM FORMING COMPOSITION

TECHNICAL FIELD

The present invention relates to a composition for forming an underlayer film between a substrate and a resist (for example, an EUV resist) used for the manufacture of semiconductor devices. Specifically, the present invention relates to a resist underlayer film forming composition for lithography for forming an underlayer film for use in the underlayer of a resist in a lithography process of the manufacture of semiconductor devices. The present invention also relates to a method for forming a resist pattern using the underlayer film forming composition.

BACKGROUND ART

Conventionally, in the manufacture of semiconductor devices, micro-processing by lithography using a photoresist has been carried out. The micro-processing is a processing method including forming a thin film of a photoresist on a semiconductor substrate such as a silicon wafer, irradiating the photoresist with active rays such as ultraviolet rays through a mask pattern in which a pattern for a semiconductor device is depicted, developing the photoresist to obtain a photoresist pattern, and etching the substrate using the obtained photoresist pattern as a protective film, thereby forming fine unevenness corresponding to the pattern on the surface of the substrate. In recent progress in high integration of semiconductor devices, shorter wavelength active rays tend to be used, i.e., an ArF excimer laser (193 nm) and EUV light (13.5 nm) have been taking the place of a KrF excimer laser (248 nm).

This tendency requires more precise control of the profile (resist shape) and higher level of adherence to the substrate than before.

A film known as a hard mask that contains a metal element such as silicon is used as an underlayer film between a semiconductor substrate and a photoresist. In this case, the resist and the hard mask significantly differ in the components, which makes the rate at which the resist and the hard mask are removed by dry etching highly dependent on the type of the gas used in the dry etching. Appropriate selection of the type of the gas allows the hard mask to be removed by dry etching without significant reduction in the film thickness of the photoresist. A resist underlayer film has been thus disposed between a semiconductor substrate and a photoresist in order to achieve various effects in the 'manufacture of semiconductor devices in recent years (see Patent Documents 1 and 2).

Although compositions for a resist underlayer film have been studied, development of a novel material for a resist underlayer film is demanded to meet diverse properties that the resist underlayer film is required to have.

PRIOR ART DOCUMENTS

Patent Documents

Patent Document 1: Japanese Patent Application Publication No. 2008-076889 (JP 2008-076889 A)

Patent Document 2: Japanese Patent Application Publication No. 2010-237667 (JP 2010-237667 A)

SUMMARY OF THE INVENTION

Problem to be Solved by the Invention

An object of the present invention is to provide a resist underlayer film forming composition for EUV lithography that allows micro-processing of a substrate by using a rectangular resist pattern and can be used in the manufacture of semiconductor devices. Specifically, an object of the present invention is to provide a resist underlayer film forming composition for lithography that forms a resist underlayer film that can be used as a hard mask. Still another object of the present invention is to provide a resist underlayer film for lithography that improves the exposure sensitivity of an EUV resist, causes no intermixing with a resist, has a high dry etching rate compared with the resist, and generates a small amount of out gases during the exposure to EUV light, and to provide a resist underlayer film forming composition for forming the underlayer film.

Means for Solving the Problem

The present invention provides:
as a first aspect, a resist underlayer film forming composition for EUV lithography, comprising: as a silane, a hydrolyzable silane, a hydrolyzate of the hydrolyzable silane, a hydrolysis condensate of the hydrolyzable silane, or a mixture of any of the hydrolyzable silane, the hydrolyzate, and the hydrolysis condensate, in which the hydrolyzable silane includes a combination of tetramethoxysilane, an alkyltrimethoxysilane, and an aryltrialkoxysilane, and the aryltrialkoxysilane is represented by formula (1):

$$(R^2)_{n2}-R^1-(CH_2)_{n1}-Si(X)_3 \qquad \text{Formula (1)}$$

(in formula (1), $R^1$ is an aromatic ring consisting of a benzene ring or a naphthalene ring or a ring including an isocyanuric acid structure, $R^2$ is a substituent replacing a hydrogen atom on the aromatic ring and is a halogen atom or a $C_{1-10}$ alkoxy group, and X is a $C_{1-10}$ alkoxy group, a $C_{2-10}$ acyloxy group, or a halogen group; and n1 is an integer of 0 or 1, and n2 is an integer of 1 to 5 for the benzene ring or an integer of 1 to 9 for the naphthalene ring);

as a second aspect, the resist underlayer film forming composition according to the first aspect, in which $R^1$ in formula (1) is a benzene ring;

as a third aspect, the resist underlayer film forming composition according to the first aspect or the second aspect, in which $R^2$ in formula (1) is a methoxy group, a methoxymethoxy group, a fluorine atom, a chlorine atom, or a bromine atom;

as a fourth aspect, the resist underlayer film forming composition according to any one of the first to third aspects, in which X in formula (1) is a methoxy group;

as a fifth aspect, the resist underlayer film forming composition according to any one of the first to fourth aspects, in which n1 in formula (1) is 0;

as a sixth aspect, the resist underlayer film forming composition according to any one of the first to fifth aspects, in which the alkyltrimethoxysilane is methyltrimethoxysilane;

as a seventh aspect, the resist underlayer film forming composition according to any one of the first to sixth aspects, in which the hydrolyzable silane includes 10 to 35 mol of an alkyltrimethoxysilane and 2 to 25 mol of an aryltrialkoxysilane relative to 70 mol of tetramethoxysilane;

as an eighth aspect, the resist underlayer film forming composition according to any one of the first to seventh aspects, in which the silane includes a methoxy group and an ethoxy group as a hydrolyzable group in a ratio (molar ratio) of methoxy group:ethoxy group=100:0 to 80:20 in the whole silane;

as a ninth aspect, the resist underlayer film forming composition according to any one of the first to eighth aspects, further comprising: an acid;

as a tenth aspect, the resist underlayer film forming composition according to any one of the first to ninth aspects, further comprising: water;

as an eleventh aspect, the resist underlayer film forming composition according to any one of the first to tenth aspects, further comprising: an ammonium compound, a cyclic ammonium compound, a cyclic amine compound, or an onium compound;

as a twelfth aspect, a resist underlayer film obtained by: applying the resist underlayer film forming composition as described in any one of the first to eleventh aspects onto a semiconductor substrate and baking the resist underlayer film forming composition;

as a thirteenth aspect, a method for manufacturing a semiconductor device, the method comprising: applying the resist underlayer film forming composition as described in any one of the first to eleventh aspects onto a semiconductor substrate and baking the resist underlayer film forming composition to form a resist underlayer film; applying a resist composition onto the resist underlayer film to form a resist film; exposing the resist film to light; developing the resist film after the exposing to obtain a resist pattern; etching the resist underlayer film through the resist pattern; and processing the semiconductor substrate through the resist film thus patterned and the resist underlayer film thus patterned; and as a fourteenth aspect, a method for manufacturing a semiconductor device, the method comprising: forming an organic underlayer film on a semiconductor substrate; applying the resist underlayer film forming composition as described in any one of the first to eleventh aspects onto the organic underlayer film and baking the resist underlayer film forming composition to form a resist underlayer film; applying a resist composition onto the resist underlayer film to form a resist film; exposing the resist film to light; developing the resist film after the exposing to obtain a resist pattern; etching the resist underlayer film through the resist pattern; etching the organic underlayer film through the resist underlayer film thus patterned; and processing the semiconductor substrate through the organic underlayer film thus patterned.

Effects of the Invention

According to the present invention, the resist underlayer film formed from the composition by EUV lithography can be used as a hard mask that has dry etching resistance to an oxygen-based dry etching gas and facilitates micro-processing of a substrate.

According to the present invention, the resist underlayer film formed from the composition can improve the exposure sensitivity of an EUV resist formed on the underlayer film.

According to the present invention, a resist underlayer film for lithography can be formed that generates a small amount of out gases when exposed to EUV light, causes no intermixing with a resist, and has a high dry etching rate compared with the resist.

According to the present invention, application of the composition allows the manufacture of semiconductor devices by using a resist underlayer film having such good properties.

MODES FOR CARRYING OUT THE INVENTION

In the present invention, a resist underlayer film is formed on a substrate by an application method or a resist underlayer film is formed on an organic underlayer film on a substrate by an application method, and a resist film (for example, an EUV resist) is formed on the resist underlayer film. A resist pattern is then formed by light exposure and development, and the resist pattern is used to dry-etch the resist underlayer film to transfer the pattern, which is then used to process the substrate. Alternatively the organic underlayer film is etched to transfer the pattern and used to process the substrate.

In the fabrication of the fine patterns, thinner resist films are used more frequently than before in order to prevent pattern collapse. The thinning of resists requires the layers present thereunder to have a higher dry etching rate than that of the resist in order to transfer the pattern. In the present invention, a resist underlayer film (containing an inorganic silicon-based compound) of the present application is applied on an organic underlayer film on a substrate or directly on a substrate, and a resist film (an organic resist film) is applied thereon. An organic component-based film and an inorganic component-based film have significantly different dry etching rates depending on a choice of an etching gas. For example, an organic component-based film has a higher dry etching rate with an oxygen-based etching gas, whereas an inorganic component-based film has a higher dry etching rate with a halogen-containing gas.

For example, a resist pattern is formed, and the resist underlayer film of the present application present thereunder is dry-etched with a halogen-containing gas to transfer the pattern to the resist underlayer film, and the pattern transferred to the resist underlayer film is used to process the substrate with a halogen-containing gas. Alternatively, the resist underlayer film having a pattern thereon is used to dry-etch an organic underlayer film present thereunder with an oxygen-based gas to transfer the pattern to the organic underlayer film and the organic underlayer film having the pattern thereon is used to process the substrate with a halogen-containing gas.

In the present invention, the resist underlayer film acts as a hard mask and hydrolyzable groups in the structure such as alkoxy groups, acyloxy groups, and halogen groups undergo full or partial hydrolysis followed by condensation of silanol groups to form a polysiloxane polymer. This polyorganosiloxane structure has a sufficient function as a hard mask.

The polyorganosiloxane structure (intermediate film) is effective for a hard mask against etching of the organic underlayer film present thereunder and processing (etching) of the substrate. In other words, the polyorganosiloxane structure has a sufficient dry-etching resistance during processing of a substrate and to an oxygen-based dry-etching gas used for the organic underlayer film.

By using alkoxyaryl groups and halogenated aryl groups in the aryltrialkoxysilane in the silane compounds used in the present invention, an EUV resist present thereon can be exposed to a lower dose of EUV light, i.e., a pattern can be formed with reduced light exposure.

Methoxy groups are preferably used as the hydrolyzable groups in the silane compounds used in the present invention. When the silane compounds undergo hydrolysis to form hydrolysis condensates thereof (polysiloxane) that are intended to be used for a resist underlayer film forming composition, some of the hydrolyzable groups may remain unhydrolyzed as silanol groups or alkoxy groups.

The alkoxy groups in the underlayer film may stay in the film after the subsequent steps. The residual alkoxy groups or their components may stick to the mirror of an exposure machine as out gases during the EUV exposure, resulting in pollution and failure of the exposure machine. The present invention can overcome this problem by using mainly methoxy groups, not mainly ethoxy groups, as the hydrolyzable groups.

The present invention relates to a resist underlayer film forming composition for EUV lithography comprising a hydrolyzable silane, a hydrolyzate thereof, a hydrolysis condensate thereof, or a mixture thereof as silanes, in which the hydrolyzable silane includes a combination of tetramethoxysilane, an alkyltrimethoxysilane, and an aryltrialkoxysilane, and in which the aryltrialkoxysilane is as shown above in formula (1).

The resist underlayer film forming composition of the present invention comprises the hydrolyzable silane, the hydrolyzate thereof, the hydrolysis condensate thereof, or the mixture thereof and further comprises a solvent. The composition may include an acid, water, an alcohol, a curing catalyst, an acid generator, another organic polymer, a light-absorbing compound, and a surfactant as optional components.

The resist underlayer film forming composition of the present invention has a solid content of, for example, 0.1% to 50% by mass, or 0.1% to 30% by mass, 0.1% to 25% by mass. Solid content as used herein refers to the component remaining after the solvent component is removed from the total component of the resist underlayer film forming composition.

The ratio of a hydrolyzable silane, a hydrolyzate thereof, and a hydrolysis condensate thereof in the solid content is 20% by mass or more, for example, 50% to 100% by mass, or 60% to 100% by mass, or 70% to 99.5% by mass.

In formula (1), $R^1$ is an aromatic ring consisting of a benzene ring or a naphthalene ring or a ring including an isocyanuric acid structure, $R^2$ is a substituent replacing a hydrogen atom on the aromatic ring and is a halogen atom or a $C_{1-10}$ alkoxy group, X is a $C_{1-10}$ alkoxy group, a $C_{2-10}$ acyloxy group, or a halogen group. n1 is an integer of 0 or 1, and n2 is an integer of 1 to 5. When n1 is 1, the silicon atom and the aromatic ring are bonded via a methylene group and when n1 is 0, the silicon atom and the aromatic ring are bonded directly.

The halogen atom of $R^2$ in formula (1) is a fluorine atom, a chlorine atom, a bromine atom, or an iodine atom.

The alkoxy group of $R^2$ in formula (1) is an alkoxy group having a linear, branched, or cyclic alkyl portion having a carbon atom number of 1 to 10 and examples of the alkoxy group include a methoxy group, an ethoxy group, an n-propoxy group, an i-propoxy group, an n-butoxy group, an i-butoxy group, an s-butoxy group, a t-butoxy group, an n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group. Examples of the cyclic alkoxy group include a cyclopropoxy group, a cyclobutoxy group, a 1-methyl-cyclopropoxy group, a 2-methyl-cyclopropoxy group, a cyclopentyloxy group, a 1-methyl-cyclobutoxy group, a 2-methyl-cyclobutoxy group, a 3-methyl-cyclobutoxy group, a 1,2-dimethyl-cyclopropoxy group, a 2,3-dimethyl-cyclopropoxy group, a 1-ethyl-cyclopropoxy group, a 2-ethyl-cyclopropoxy group, a cyclohexyloxy group, a 1-methyl-cyclopentyloxy group, a 2-methyl-cyclopentyloxy group, a 3-methyl-cyclopentyloxy group, a 1-ethyl-cyclobutoxy group, a 2-ethyl-cyclobutoxy group, a 3-ethyl-cyclobutoxy group, a 1,2-dimethyl-cyclobutoxy group, a 1,3-dimethyl-cyclobutoxy group, a 2,2-dimethyl-cyclobutoxy group, a 2,3-dimethyl-cyclobutoxy group, a 2,4-dimethyl-cyclobutoxy group, a 3,3-dimethyl-cyclobutoxy group, a 1-n-propyl-cyclopropoxy group, a 2-n-propyl-cyclopropoxy group, a 1-i-propyl-cyclopropoxy group, a 2-i-propyl-cyclopropoxy group, a 1,2,2-trimethyl-cyclopropoxy group, a 1,2,3-trimethyl-cyclopropoxy group, a 2,2,3-trimethyl-cyclopropoxy group, a 1-ethyl-2-methyl-cyclopropoxy group, a 2-ethyl-1-methyl-cyclopropoxy group, a 2-ethyl-2-methyl-cyclopropoxy group, and a 2-ethyl-3-methyl-cyclopropoxy group.

The alkoxy group of $R^2$ in formula (1) includes an alkoxyalkoxy group. Examples include a methoxymethoxy group, an ethoxyethoxy group, a methoxyethoxy group, and an ethoxymethoxy group.

Among the alkoxy group of $R^2$ in formula (1), a methoxy group and a methoxymethoxy group can be preferably used.

The $C_{1-10}$ alkoxy group of X in formula (1) is an alkoxy group having a linear, branched, or cyclic alkyl portion having a carbon atom number of 1 to 10 and examples of the $C_{1-10}$ alkoxy group include a methoxy group, an ethoxy group, an n-propoxy group, an i-propoxy group, an n-butoxy group, an i-butoxy group, an s-butoxy group, a t-butoxy group, an n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group. Examples of the cyclic alkoxy group include a cyclopropoxy group, a cyclobutoxy group, a 1-methyl-cyclopropoxy group, a 2-methyl-cyclopropoxy group, a cyclopentyloxy group, a 1-methyl-cyclobutoxy group, a 2-methyl-cyclobutoxy group, a 3-methyl-cyclobutoxy group, a 1,2-dimethyl-cyclopropoxy group, a 2,3-dimethyl-cyclopropoxy group, a 1-ethyl-cyclopropoxy group, a 2-ethyl-cyclopropoxy group, a cyclohexyloxy group, a 1-methyl-cyclopentyloxy group, a 2-methyl-cyclopentyloxy group, a 3-methyl-cyclopentyloxy group, a 1-ethyl-cyclobutoxy group, a 2-ethyl-cyclobutoxy group, a 3-ethyl-cyclobutoxy group, a 1,2-dimethyl-cyclobutoxy group, a 1,3-dimethyl-cyclobutoxy group, a 2,2-dimethyl-cyclobutoxy group, a 2,3-dimethyl-cyclobutoxy group, a 2,4-dimethyl-cyclobutoxy group, a 3,3-dimethyl-cyclobutoxy group, a 1-n-propyl-cyclopropoxy group, a 2-n-propyl-cyclopropoxy group, a 1-i-propyl-cyclopropoxy group, a 2-i-propyl-cyclopropoxy group, a 1,2,2-trimethyl-cyclopropoxy group, a 1,2,3-trimethyl-cyclopropoxy group, a 2,2,3-trimethyl-cyclopropoxy group, a 1-ethyl-2-methyl-cyclopropoxy group, a 2-ethyl-1-methyl-cyclopropoxy group, a 2-ethyl-2-methyl-cyclopropoxy group, and a 2-ethyl-3-methyl-cyclopropoxy group.

The $C_{2-10}$ acyloxy group of X in formula (1) includes a methylcarbonyloxy group, an ethylcarbonyloxy group, an n-propylcarbonyloxy group, an i-propylcarbonyloxy group, an n-butylcarbonyloxy group, an i-butylcarbonyloxy group, an s-butylcarbonyloxy group, a t-butylcarbonyloxy group, an n-pentylcarbonyloxy group, a 1-methyl-n-butylcarbonyloxy group, a 2-methyl-n-butylcarbonyloxygroup, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, an n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, a 2,2-dimethyl-n-butylcarbonyloxy group, a 2,3-dimethyl-n-butylcarbonyloxy group, a 3,3-dimethyl-n-butylcarbonyloxy group, a 1-ethyl-n-butylcarbonyloxy group, a 2-ethyl-n-butylcarbonyloxy group, a 1,1,2-trimethyl-n-propylcarbonyloxy group, a 1,2,2-trimethyl-n-propylcarbonyloxy group, a 1-ethyl-1-methyl-n-propylcarbonyloxy group, a 1-ethyl-2-methyl-n-propylcarbonyloxy group, a phenylcarbonyloxy group, and a tosylcarbonyloxy group.

The halogen group of X in formula (1) includes fluorine, chlorine, bromine, and iodine.

A compound of formula (1) is preferably used in which $R^1$ is a benzene ring, $R^2$ is a methoxy group, a methoxymethoxy group, a fluorine atom, a chlorine atom, or a bromine atom, X is a methoxy group, and n1 is an integer of 0.

The hydrolyzable silane in formula (1) may be exemplified as below.

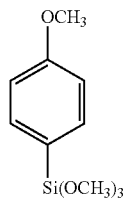

Formula (1-1)

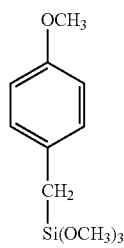

Formula (1-2)

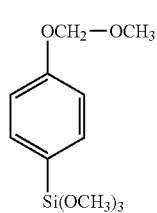

Formula (1-3)

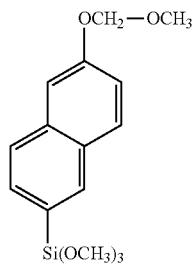

Formula (1-4)

-continued

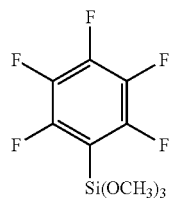

Formula (1-5)

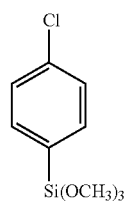

Formula (1-6)

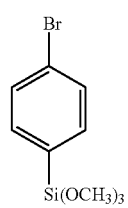

Formula (1-7)

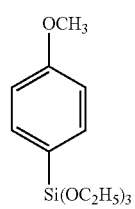

Formula (1-8)

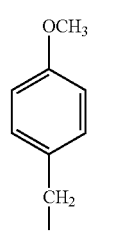

Formula (1-9)

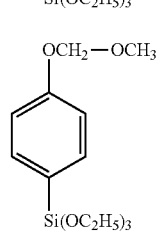

Formula (1-10)

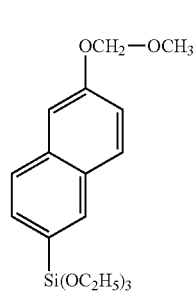

Formula (1-11)

-continued

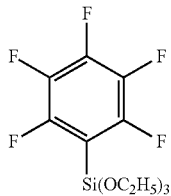
Formula (1-12)

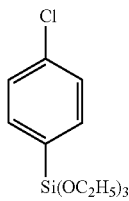
Formula (1-13)

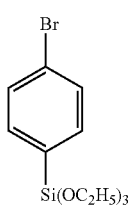
Formula (1-14)

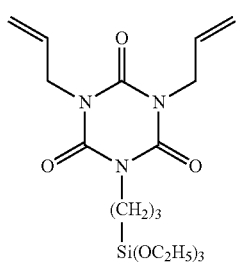
Formula (1-15)

The alkyl group in the alkyltrimethoxysilane is a linear or branched alkyl group having a carbon atom number of 1 to 10 and examples of the alkyl group include a methyl group, an ethyl group, an n-propyl group, an i-propyl group, an n-butyl group, an i-butyl group, an s-butyl group, a t-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group. A cyclic alkyl group may also be used and examples of the cyclic $C_{1-10}$ alkyl group include a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Methyl groups are preferably used and the alkyltrimethoxysilane is preferably methyltrimethoxysilane.

The hydrolyzable silane is preferably used in which the silanes include 10 to 35 mol of an alkyltrimethoxysilane and 2 to 25 mol of an aryltrialkoxysilane relative to 70 mol of tetramethoxysilane.

Specific examples of the hydrolysis condensate (polyorganosilane) of the hydrolyzable silane may be exemplified as below.

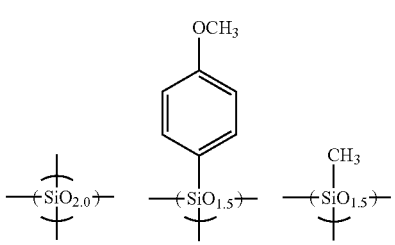
Formula (2-1)

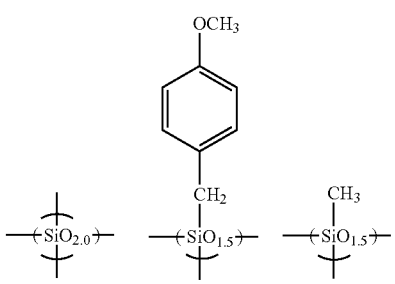
Formula (2-2)

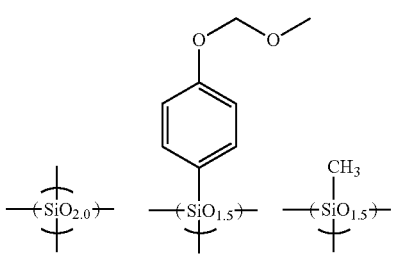
Formula (2-3)

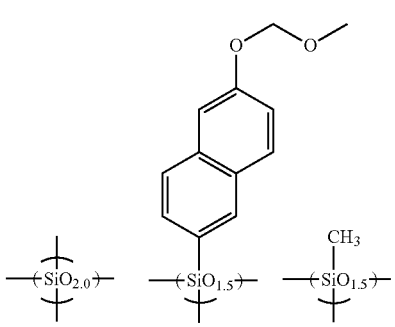
Formula (2-4)

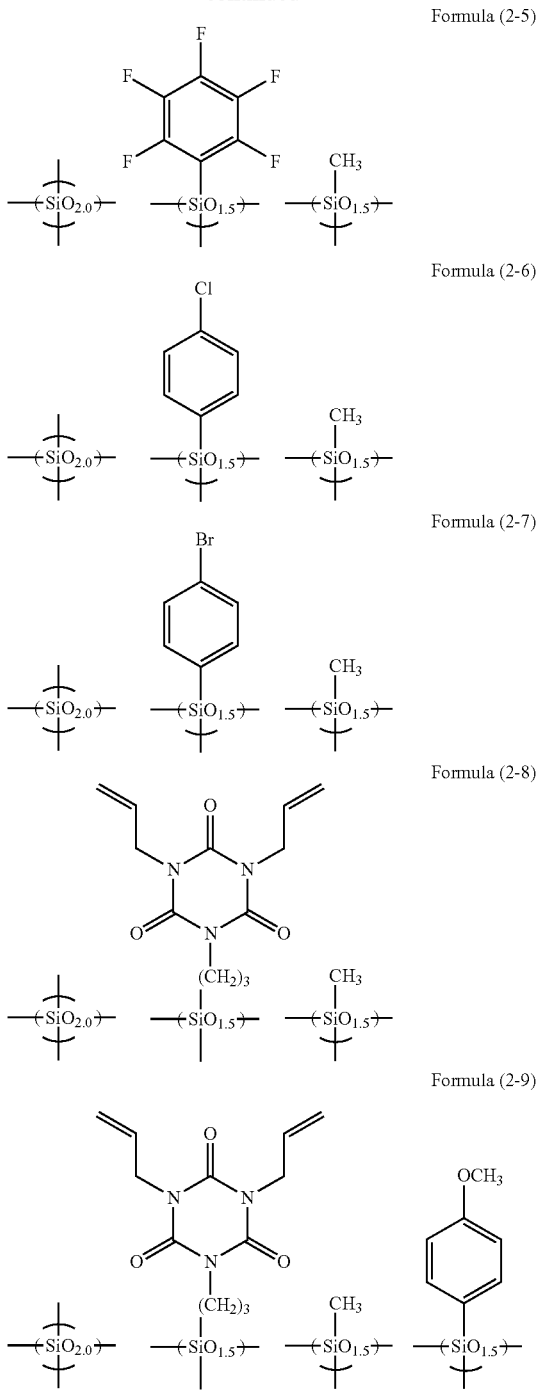

Formula (2-5)
Formula (2-6)
Formula (2-7)
Formula (2-8)
Formula (2-9)

The hydrolysis condensate (polyorganosilane) of the hydrolyzable silane may have a weight-average molecular weight of 1,000 to 1,000,000, or 1,000 to 100,000. This molecular weight is a molecular weight in terms of polystyrene as measured by GPC analysis.

Examples of the condition for the GPC measurement include: using a GPC apparatus (trade name: HLC-8220GPC; manufactured by Tosoh Corporation); using a GPC column (trade names: Shodex KF803L, KF802, and KF801; manufactured by Showa Denko K.K.); using a column temperature of 40° C.; using tetrahydrofuran as the eluent (eluting solvent); using a flow amount (flow rate) of 1.0 ml/min; and using polystyrene (manufactured by Showa Denko K.K.) as the standard sample.

The alkoxysilyl group, the acyloxysilyl group, or the halogenated silyl group is a hydrolyzable group and 0.5 to 100 mol, preferably 1 to 10 mol of water is used per mole of the hydrolyzable group for the hydrolysis of the hydrolyzable group.

A hydrolysis catalysis may be used in an amount of 0.001 to 10 mol, preferably 0.001 to 1 mol per mole of the hydrolyzable group.

The reaction temperature during hydrolysis and condensation is usually 20° C. to 90° C.

Hydrolysis may be performed fully or partially. In other words, the hydrolysis condensate may contain hydrolyzates and monomers. A catalyst can be used for hydrolysis and condensation.

Examples of the hydrolysis catalyst include a metal chelate compound, an organic acid, an inorganic acid, an organic base, and an inorganic base.

Examples of the metal chelate compound as the hydrolysis catalyst include: titanium chelate compounds such as triethoxy.mono(acetylacetonate)titanium, tri-n-propoxy.mono(acetylacetonate)titanium, tri-i-propoxy.mono(acetylacetonate)titanium, tri-n-butoxy.mono(acetylacetonate)titanium, tri-sec-butoxy.mono(acetylacetonate)titanium, tri-t-butoxy.mono(acetylacetonate)titanium, diethoxy.bis(acetylacetonate)titanium, di-n-propoxy.bis(acetylacetonate)titanium, di-i-propoxy.bis(acetylacetonate)titanium, di-n-butoxy.bis(acetylacetonate)titanium, di-sec-butoxy.bis(acetylacetonate)titanium, di-t-butoxy.bis(acetylacetonate)titanium, monoethoxy.tris(acetylacetonate)titanium, mono-n-propoxy.tris(acetylacetonate)titanium, mono-i-propoxy.tris(acetylacetonate)titanium, mono-n-butoxy.tris(acetylacetonate)titanium, mono-sec-butoxy.tris(acetylacetonate)titanium, mono-t-butoxy.tris(acetylacetonate)titanium, tetrakis(acetylacetonate)titanium, triethoxy.mono(ethylacetoacetate)titanium, tri-n-propoxy.mono(ethylacetoacetate)titanium, tri-i-propoxy.mono(ethylacetoacetate)titanium, tri-n-butoxy.mono(ethylacetoacetate)titanium, tri-sec-butoxy.mono(ethylacetoacetate)titanium, tri-t-butoxy.mono(ethylacetoacetate)titanium, diethoxy.bis(ethylacetoacetate)titanium, di-n-propoxy.bis(ethylacetoacetate)titanium, di-i-propoxy.bis(ethylacetoacetate)titanium, di-n-butoxy.bis(ethylacetoacetate)titanium, di-sec-butoxy.bis(ethylacetoacetate)titanium, di-t-butoxy.bis(ethylacetoacetate)titanium, monoethoxy.tris(ethylacetoacetate)titanium, mono-n-propoxy.tris(ethylacetoacetate)titanium, mono-i-propoxy.tris(ethylacetoacetate)titanium, mono-n-butoxy.tris(ethylacetoacetate)titanium, mono-sec-butoxy.tris(ethylacetoacetate)titanium, mono-t-butoxy.tris(ethylacetoacetate)titanium, tetrakis(ethylacetoacetate)titanium, mono(acetylacetonate)tris(ethylacetoacetate)titanium, bis(acetylacetonate)bis(ethylacetoacetate)titanium, and tris(acetylacetonate)mono(ethylacetoacetate)titanium; zirconium chelate compounds such as triethoxy.mono(acetylacetonate)zirconium, tri-n-propoxy.mono(acetylacetonate)zirconium, tri-i-propoxy.mono(acetylacetonate)zirconium, tri-n-butoxy.mono(acetylacetonate)zirconium, tri-sec-butoxy.mono(acetylacetonate)zirconium, tri-t-butoxy.mono(acetylacetonate)zirconium, diethoxy.bis(acetylacetonate)zirconium, di-n-propoxy.bis(acetylacetonate)zirconium, di-i-propoxy.bis(acetylacetonate)zirconium, di-n-butoxy.bis(acetylacetonate)zirconium, di-sec-butoxy.bis(acetylacetonate)zirconium, di-t-butoxy.bis(acetylacetonate)zirconium, monoethoxy.tris(acetylacetonate)zirconium, mono-n-propoxy.tris(acetylacetonate)zirconium, mono-i-propoxy.tris (acetylacetonate)zirconium, mono-n-butoxy.tris(acetylacetonate)zirconium, mono-sec-butoxy.tris(acetylacetonate)zirconium, mono-t-butoxy.tris(acetylacetonate)zirconium, tetrakis(acetylacetonate)zirconium, triethoxy.mono(ethylacetoacetate)zirconium, tri-n-propoxy.mono(ethylacetoacetate)zirconium, tri-i-propoxy.mono(ethylacetoacetate)zirconium, tri-n-butoxy.mono(ethylacetoacetate)zirconium, tri-sec-butoxy.mono(ethylacetoacetate)zirconium, tri-t-butoxy.mono(ethylacetoacetate)zirconium, diethoxy.bis(ethylacetoacetate)zirconium, di-n-propoxy.bis(ethylacetoacetate)zirconium, di-i-propoxy.bis(ethylacetoacetate)zirconium, di-n-butoxy.bis(ethylacetoacetate)zirconium, di-sec-butoxy.bis(ethylacetoacetate)zirconium, di-t-butoxy.bis(ethylacetoacetate)zirconium, monoethoxy.tris(ethylacetoacetate)zirconium, mono-n-propoxy.tris(ethylacetoacetate)zirconium, mono-i-propoxy.tris(ethylacetoacetate)zirconium, mono-n-butoxy.tris(ethylacetoacetate)zirconium, mono-sec-butoxy.tris(ethylacetoacetate)zirconium, mono-t-butoxy.tris(ethylacetoacetate)zirconium, tetrakis(ethylacetoacetate)zirconium, mono(acetylacetonate)tris(ethylacetoacetate)zirconium, bis(acetylacetonate)bis(ethylacetoacetate)zirconium, and tris(acetylacetonate)mono(ethylacetoacetate)zirconium; and aluminum chelate compounds such as tris(acetylacetonate)aluminum and tris(ethylacetoacetate)aluminum.

Examples of the organic acid as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid as the hydrolysis catalyst include hydrochloric acid, nitric acid, sulfuric acid, hydrofluoric acid, and phosphoric acid.

Examples of the organic base as the hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, and tetramethylammonium hydroxide. Examples of the inorganic base include ammonia, sodium hydroxide, potassium hydroxide, barium hydroxide, and calcium hydroxide. Among these catalysts, metal chelate compounds, organic acids, and inorganic acids are preferred and these catalysts may be used singly or in combination of two or more thereof.

Examples of the organic solvent used for the hydrolysis include: aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, and n-amylnaphthalene; monoalcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyalcohol solvents such as ethylene glycol, propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerin; ketone solvents such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether solvents such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethyleneglycol monomethyl ether acetate, ethyleneglycol monoethyl ether acetate, diethyleneglycol monomethyl ether acetate, diethyleneglycol monoethyl ether acetate, diethyleneglycol mono-n-butyl ether acetate, propyleneglycol monomethyl ether acetate, propyleneglycol monoethyl ether acetate, propyleneglycol monopropyl ether acetate, propyleneglycol monobutyl ether acetate, dipropyleneglycol monomethyl ether acetate, dipropyleneglycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethylsulfoxide, sulfolane, and 1,3-propane sultone. These solvents may be used singly or in combination of two or more thereof.

In particular, ketone solvents such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethyl nonanone, cyclohexanone, methylcyclohexanone, 2,4-pentanedione, acetonylacetone, diacetone alcohol, acetophenone, fenchone (1,1,3-trimethyl-2-norbornene) are preferred in terms of the storage stability of the solution thereof.

From the hydrolysis condensate (polymer) obtained by hydrolyzing and condensing a hydrolyzable organosilane in a solvent using a catalyst, an alcohol as a by-product, the hydrolysis catalyst used, and water can simultaneously be removed by distilling them under reduced pressure or the like. The acid or the base catalyst used for the hydrolysis can be removed by neutralization or ion-exchange. In the resist underlayer film forming composition for lithography of the present invention containing the hydrolysis condensate thereof, an acid (for example, an organic acid), water, an alcohol, or a combination thereof can be added to stabilize the composition.

Examples of the organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Among them, oxalic acid and maleic acid are preferred. The amount of the organic acid to be added is 0.5 to 5.0 parts by mass, relative to 100 parts by mass of the condensate (polyorganosiloxane). As the water to be added, pure water, ultrapure water, ion-exchanged water, or the like can be used and the water can be added in an amount of 1 to 20 part(s) by mass, relative to 100 parts by mass of the resist underlayer film forming composition.

As the alcohol to be added, an alcohol that is easily vaporized by heating after the application is preferred and examples thereof include methanol, ethanol, propanol, isopropanol, and butanol. The alcohol can be added in an amount of 1 to 20 part(s) by mass, relative to 100 parts by mass of the resist underlayer film forming composition.

In the present invention, a cross-linking compound may be included. As the cross-linking agent, a cross-linking compound having at least two cross-linking substituents is preferably used. For example, a melamine-based compound having cross-linking substituents such as a methylol group and a methoxymethyl group and a substituted urea-based compound may be mentioned. Specifically, compounds such as methoxymethylated glycoluril or methoxymethylated melamine, for example, tetramethoxymethyl glycoluril, tetrabutoxymethyl glycoluril, or hexamethoxymethyl melamine may be mentioned. Compounds such as tetramethoxymethyl urea and tetrabutoxy methyl urea may also be mentioned. The cross-linking agent, if present, is used in an amount of, for example, 50% by mass or less, 0.01% to 50% by mass, or 10% to 40% by mass in the solid content.

The resist underlayer film forming composition of the present invention may include an acid compound. As the acid compound, for example, sulfonic acid compounds such as p-toluenesulfonic acid, trifluoromethanesulfonic acid, and pyridinium-p-toluene sulfonate and carboxylic acid compounds such as salicylic acid, sulfosalicylic acid, citric acid, benzoic acid, and hydroxy benzoic acid may be mentioned. As the acid compound, for example, acid generators, which generate an acid by the effect of heat or light, such as 2,4,4,6-tetrabromocyclohexadienone, benzoin tosylate, 2-nitrobenzyltosylate, p-trifluoromethylbenzenesulfonic acid-2,4-dinitrobenzyl, phenyl-bis(trichloromethyl)-s-triazine, and N-hydroxysuccinimide trifluoromethanesulfonate may be mentioned. As the acid compound, iodonium salt-based acid generators such as diphenyliodonium hexafluorophosphate, diphenyliodonium trifluoromethanesulfonate, and bis(4-tert-butylphenyl)iodonium trifluoromethanesulfonate, and sulfonium acid-based acid generators such as triphenylsulfonium hexafluoroantimonate and triphenylsulfonium trifluoromethanesulfonate may also be mentioned. As the acid compound, a sulfonic acid compound, an iodonium salt-based acid generator, and a sulfonium salt-based acid generator are preferably used. The acid compound may be used singly or in combination of two or more thereof. The acid compound is present in an amount of, for example, 0.1% to 10% by mass, or 0.1% to 5% by mass in the solid content.

The resist underlayer film forming composition of the present invention may include a curing catalyst. The curing catalyst works when a coated film that contains a polyorganosiloxane consisting of a hydrolysis condensate is heated and cured.

Furthermore, an ammonium compound, a cyclic ammonium compound, a cyclic amine compound, or an onium compound may be used.

As the onium compound, an onium salt, for example, a sulfonium salt may be used. Examples of the sulfonium salt include salts of a sulfonium ion of the following formula:

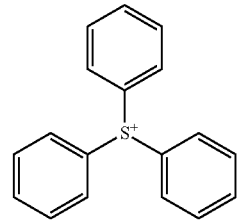 [SMILES: c1ccc([S+](c2ccccc2)c2ccccc2)cc1]

and an anion of the following formulae:

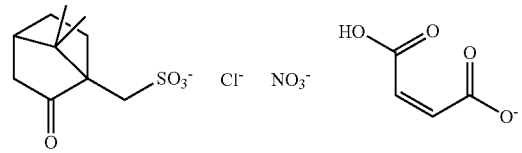

The curing catalyst is used in an amount of 0.01 to 10 parts by mass, or 0.01 to 5 parts by mass, or 0.01 to 3 parts by mass relative to 100 parts by mass of polyorganosilloxane. The salt of a sulfonic acid ion that contains a hydrocarbon group, a chloride ion, a nitrate ion, a maleate ion or an onium ion is used in an amount of 0.1 to 10% by mass, or 0.1% to 5% by mass, or 0.1% to 3% by mass relative to 100 parts by mass of polyorganosilloxane.

As the rheology modifier, for example, phthalate compounds such as dimethyl phthalate, diethyl phthalate, diisobutyl phthalate, dihexyl phthalate, and butyl isodecyl phthalate, adipate compounds such as di-n-butyl adipate, diisobutyl adipate, diisooctyl adipate, and octyl decyl adipate, maleate compounds such as di-n-butyl maleate, diethyl maleate, and dinonyl maleate, oleate compounds such as methyl oleate, butyl oleate, and tetrahydrofurfuryl oleate, and stearate compounds such as n-butyl stearate and glyceryl stearate may be mentioned. When the rheology modifier is used, it is used in an amount of, for example, 0.001% to 10% by mass in the solid content.

Examples of the surfactant include: nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene.polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorinated surfactants, for example, EFTOP EF301, EF303, and EF352 (trade name; manufactured by Tohkem Products Corp.), MEGAFAC F171, F173, R-08, and R-30 (trade name; manufactured by Dainippon Ink and Chemicals, Inc.), Fluorad FC430 and FC431 (manufactured by Sumitomo 3M Limited), AsahiGuard AG710 and Surflon S-382, SC101, SC102, SC103, SC104, SC105, and SC106 (trade name; manufactured by Asahi Glass Co., Ltd.); and Organosiloxane polymer KP341 (manufactured by Shin-Etsu Chemical Co., Ltd.). These surfactants may be used singly or in combination of two or more thereof. When the surfactant is used, it is used in an amount of 0.0001% to 5% by mass in the solid content.

The solvent used for the resist underlayer film forming composition of the present invention is not particularly limited so long as the solvent can dissolve the above solid content. Examples of the solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These solvents are used singly or in combination of two or more thereof. In addition, high boiling point solvents such as propylene glycol monobutyl ether and propylene glycol monobutyl ether acetate may be used in combination.

The resist underlayer film forming composition of the present invention is applied on a semiconductor substrate (for example, a silicon/siliocn dioxide coated substrate, a silicon nitride substrate, a glass substrate, and an ITO substrate) by an appropriate coating method such as the use of a spinner and a coater, and the substrate is baked to form a resist underlayer film.

The baking condition is suitably selected from the baking temperature of 80° C. to 250° C. and the baking time of 0.3 to 60 minutes. Preferably, the baking temperature is 130° C. to 250° C. and the baking time is 0.5 to 5 minutes. The thickness of the resist underlayer film formed is, for example, 0.01 to 3.0 μm, preferably, for example, 0.01 to 1.0 μm, or 0.01 to 0.5 μm, or 0.01 to 0.05 μm.

A layer of a high energy beam resist such as an EUV resist is then formed on the resist underlayer film. The high energy beam resist layer can be formed by a well-known method, i.e., applying a solution of a high energy beam resist composition onto the underlayer film and baking.

As the EUV resist, a resist composition including a resin such as PMMA (polymethyl methacrylate), polyhydroxystyrene, and a phenol resin can be used.

Subsequently, exposure to light through a predetermined mask is performed. Light such as EUV light (13.5 nm), electron beam, and X ray may be used. After the exposure, post exposure bake (PEB) may be performed as necessary. Post exposure bake is performed under the condition suitably selected from the heating temperature of 70° C. to 150° C. and the heating time of 0.3 to 10 minutes.

Development with a developer is then conducted. The developer includes an alkaline aqueous solution such as an aqueous solution of an alkali metal hydroxide such as potassium hydroxide and sodium hydroxide, an aqueous solution of a quaternary ammonium hydroxide such as tetramethylammonium hydroxide, tetraethylammonium hydroxide, and choline, and an aqueous solution of an amine such as ethanolamine, propylamine, and ethylenediamine. The developer may further include a surfactant and the like. The development condition is suitably selected from the temperature of 5° C. to 50° C. and the period of 10 to 300 seconds.

Using the pattern of the photoresist formed in this way as a protective film, the resist underlayer film is removed and the semiconductor substrate is processed. The resist underlayer film is removed with a gas such as tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, and chlorine trifluoride.

Before a resist underlayer film of the present invention is formed on a semiconductor substrate, a planarization film, a gap-filling material layer, and an organic underlayer film may be formed. When a semiconductor substrate having a large level difference or a hole is used, a planarization film or a gap-filling material layer is preferably formed.

EXAMPLES

Synthetic Example 1

Into a 300 ml flask, 18.60 g of tetramethoxysilane, 3.48 g of methyltrimethoxysilane, 1.62 g of (4-methoxyphenyl)trimethoxysilane, and 35.55 g of acetone were charged and the mixed solution was stirred with a magnetic stirrer while 5.21 g of 0.01 mol/l hydrochloric acid was added dropwise to the mixed solution. After the addition, the flask was transferred in an oil bath heated at 85° C. and the mixture was heated under reflux and allowed to react for 240 minutes. The reaction solution was then cooled to room temperature and 48.00 g of propylene glycol monomethyl ether acetate was added to the reaction solution. Methanol, which was a byproduct, acetone, water, and hydrochloric acid were distilled off under reduced pressure, and the solution was concentrated to obtain a solution of the hydrolysis condensate (polymer) in propylene glycol monomethyl ether acetate. Propylene glycol monoethyl ether was added such that the ratio of propylene glycol monomethyl ether acetate/propylene glycol monoethyl ether was 20/80 and the solution was adjusted to be at 20% by mass in terms of solid residual at 140° C. The obtained polymer corresponds to formula (2-1) and the molar ratio of the unit structure derived from tetramethoxysilane, the unit structure derived from methyltrimethoxysilane, and the unit structure derived from (4-methoxyphenyl)trimethoxysilane was 70:25:5 in the polysiloxane. The weight-average molecular weight as measured by GPC was Mw 2,000 in terms of polystyrene.

Synthetic Example 2

Into a 300 ml flask, 18.60 g of tetramethoxysilane, 3.48 g of methyltrimethoxysilane, 1.97 g of (4-methoxybenzyl)trimethoxysilane, and 35.55 g of acetone were charged and the mixed solution was stirred with a magnetic stirrer while 5.21 g of 0.01 mol/1 hydrochloric acid was added dropwise to the mixed solution. After the addition, the flask was transferred in an oil bath heated at 85° C. and the mixture was heated under reflux and allowed to react for 240 minutes. The reaction solution was then cooled to room temperature and 48.00 g of propylene glycol monomethyl ether acetate was added to the reaction solution. Methanol, which was a byproduct, acetone, water, and hydrochloric acid were distilled off under reduced pressure, and the solution was concentrated to obtain a solution of the hydrolysis condensate (polymer) in propylene glycol monomethyl ether acetate. Propylene glycol monoethyl ether was added such that the ratio of propylene glycol monomethyl ether acetate/propylene glycol monoethyl ether was 20/80 and the solution was adjusted to be at 20% by mass in terms of solid residual at 140° C. The obtained polymer corresponds to formula (2-2) and the molar ratio of the unit structure derived from tetramethoxysilane, the unit structure derived from methyltrimethoxysilane, and the unit structure derived from (4-methoxybenzyl)trimethoxysilane was 70:25:5 in the polysiloxane. The weight-average molecular weight as measured by GPC was Mw 2,000 in terms of polystyrene.

Synthetic Example 3

Into a 300 ml flask, 18.60 g of tetramethoxysilane, 3.48 g of methyltrimethoxysilane, 1.82 g of [4-(methoxymethoxy)phenyl]trimethoxysilane, and 35.55 g of acetone were charged and the mixed solution was stirred with a magnetic stirrer while 5.21 g of 0.01 mol/1 hydrochloric acid was added dropwise to the mixed solution. After the addition, the flask was transferred in an oil bath heated at 85° C. and the mixture was heated under reflux and allowed to react for 240 minutes. The reaction solution was then cooled to room temperature and 48.00 g of propylene glycol monomethyl ether acetate was added to the reaction solution. Methanol, which was a byproduct, acetone, water, and hydrochloric acid were distilled off under reduced pressure, and the solution was concentrated to obtain a solution of the hydrolysis condensate (polymer) in propylene glycol monomethyl ether acetate. Propylene glycol monoethyl ether was added such that the ratio of propylene glycol monomethyl ether acetate/propylene glycol monoethyl ether was 20/80 and the solution was adjusted to be at 20% by mass in terms of solid residual at 140° C. The obtained polymer corresponds to formula (2-3) and the molar ratio of the unit structure derived from tetramethoxysilane, the unit structure derived from methyltrimethoxysilane, and the unit structure derived from [4-(methoxymethoxy)phenyl]trimethoxysilane was 70:25:5 in the polysiloxane. The weight-average molecular weight as measured by GPC was Mw 2,000 in terms of polystyrene.

Synthetic Example 4

Into a 300 ml flask, 18.60 g of tetramethoxysilane, 3.48 g of methyltrimethoxysilane, 2.19 g of {2-[6-(methoxymethoxy)naphthyl]}trimethoxysilane, and 35.55 g of acetone were charged and the mixed solution was stirred with a magnetic stirrer while 5.21 g of 0.01 mol/1 hydrochloric acid was added dropwise to the mixed solution. After the addition, the flask was transferred in an oil bath heated at 85° C. and the mixture was heated under reflux and allowed to react for 240 minutes. The reaction solution was then cooled to room temperature and 48.00 g of propylene glycol monomethyl ether acetate was added to the reaction solution. Methanol, which was a byproduct, acetone, water, and hydrochloric acid were distilled off under reduced pressure, and the solution was concentrated to obtain a solution of the hydrolysis condensate (polymer) in propylene glycol monomethyl ether acetate. Propylene glycol monoethyl ether was added such that the ratio of propylene glycol monomethyl ether acetate/propylene glycol monoethyl ether was 20/80 and the solution was adjusted to be at 20% by mass in terms of solid residual at 140° C. The obtained polymer corresponds to formula (2-4) and the molar ratio of the unit structure derived from tetramethoxysilane, the unit structure derived from methyltrimethoxysilane, and the unit structure derived from {2-[6-(methoxymethoxy)naphthyl]}trimethoxysilane was 70:25:5 in the polysiloxane. The weight-average molecular weight as measured by GPC was Mw 2,000 in terms of polystyrene.

Synthetic Example 5

Into a 300 ml flask, 18.60 g of tetramethoxysilane, 3.48 g of methyltrimethoxysilane, 2.03 g of pentafluorophenyltriethoxysilane, and 35.55 g of acetone were charged and the mixed solution was stirred with a magnetic stirrer while 5.21 g of 0.01 mol/1 hydrochloric acid was added dropwise to the mixed solution. After the addition, the flask was transferred in an oil bath heated at 85° C. and the mixture was heated under reflux and allowed to react for 240 minutes. The reaction solution was then cooled to room temperature and 48.00 g of propylene glycol monomethyl ether acetate was added to the reaction solution. Methanol and ethanol, which were byproducts, acetone, water, and hydrochloric acid were distilled off under reduced pressure, and the solution was concentrated to obtain a solution of the hydrolysis condensate (polymer) in propylene glycol monomethyl ether acetate. Propylene glycol monoethyl ether was added such that the ratio of propylene glycol monomethyl ether acetate/propylene glycol monoethyl ether was 20/80 and the solution was adjusted to be at 20% by mass in terms of solid residual at 140° C. The obtained polymer corresponds to formula (2-5) and the molar ratio of the unit structure derived from tetramethoxysilane, the unit structure derived from methyltrimethoxysilane, and the unit structure derived from pentafluorophenyltriethoxysilane was 70:25:5 in the polysiloxane. The weight-average molecular weight as measured by GPC was Mw 2,000 in terms of polystyrene.

Synthetic Example 6

Into a 300 ml flask, 18.60 g of tetramethoxysilane, 3.48 g of methyltrimethoxysilane, 1.62 g of (4-chlorophenyl)triethoxysilane, and 35.55 g of acetone were charged and the mixed solution was stirred with a magnetic stirrer while 5.21 g of 0.01 mol/1 hydrochloric acid was added dropwise to the mixed solution. After the addition, the flask was transferred in an oil bath heated at 85° C. and the mixture was heated under reflux and allowed to react for 240 minutes. The reaction solution was then cooled to room temperature and 48.00 g of propylene glycol monomethyl ether acetate was added to the reaction solution. Methanol and ethanol, which were byproducts, acetone, water, and hydrochloric acid were distilled off under reduced pressure, and the solution was concentrated to obtain a solution of the hydrolysis condensate (polymer) in propylene glycol monomethyl ether acetate. Propylene glycol monoethyl ether was added such that the ratio of propylene glycol monomethyl ether acetate/propylene glycol monoethyl ether was 20/80 and the solution was adjusted to be at 20% by mass in terms of solid residual at 140° C. The obtained polymer corresponds to formula (2-6) and the molar ratio of the unit structure derived from tetramethoxysilane, the unit structure derived from methyltrimethoxysilane, and the unit structure derived from (4-chlorophenyl)triethoxysilane was 70:25:5 in the polysiloxane. The weight-average molecular weight as measured by GPC was Mw 2,000 in terms of polystyrene.

Synthetic Example 7

Into a 300 ml flask, 18.60 g of tetramethoxysilane, 3.48 g of methyltrimethoxysilane, 1.75 g of (4-bromophenyl)trimethoxysilane, and 35.55 g of acetone were charged and the mixed solution was stirred with a magnetic stirrer while 5.21 g of 0.01 mol/1 hydrochloric acid was added dropwise to the mixed solution. After the addition, the flask was transferred in an oil bath heated at 85° C. and the mixture was heated under reflux and allowed to react for 240 minutes. The reaction solution was then cooled to room temperature and 48.00 g of propylene glycol monomethyl ether acetate was added to the reaction solution. Methanol, which was a byproduct, acetone, water, and hydrochloric acid were distilled off under reduced pressure, and the solution was concentrated to obtain a solution of the hydrolysis condensate (polymer) in propylene glycol monomethyl ether acetate. Propylene glycol monoethyl ether was added such that the ratio of propylene glycol monomethyl ether acetate/propylene glycol monoethyl ether was 20/80 and the solution was adjusted to be at 20% by mass in terms of solid residual at 140° C. The obtained polymer corresponds to formula (2-7) and the molar ratio of the unit structure derived from tetramethoxysilane, the unit structure derived from methyltrimethoxysilane, and the unit structure derived from (4-bromophenyl)trimethoxysilane was 70:25:5 in the polysiloxane. The weight-average molecular weight as measured by GPC was Mw 2,000 in terms of polystyrene.

Synthetic Example 8

Into a 300 ml flask, 18.60 g of tetramethoxysilane, 3.48 g of methyltrimethoxysilane, 3.24 g of (4-methoxyphenyl)trimethoxysilane, and 35.55 g of acetone were charged and the mixed solution was stirred with a magnetic stirrer while 5.21 g of 0.01 mol/1 hydrochloric acid was added dropwise to the mixed solution. After the addition, the flask was transferred in an oil bath heated at 85° C. and the mixture was heated under reflux and allowed to react for 240 minutes. The reaction solution was then cooled to room temperature and 48.00 g of propylene glycol monomethyl ether acetate was added to the reaction solution. Methanol, which was a byproduct, acetone, water, and hydrochloric acid were distilled off under reduced pressure, and the solution was concentrated to obtain a solution of the hydrolysis condensate (polymer) in propylene glycol monomethyl ether acetate. Propylene glycol monoethyl ether was added such that the ratio of propylene glycol monomethyl ether acetate/propylene glycol monoethyl ether was 20/80 and the solution was adjusted to be at 20% by mass in terms of solid residual at 140° C. The obtained polymer corresponds to formula (2-1) and the molar ratio of the unit structure derived from tetramethoxysilane, the unit structure derived from methyltrimethoxysilane, and the unit structure derived from (4-methoxyphenyl)trimethoxysilane was 70:25:15 in the polysiloxane. The weight-average molecular weight as measured by GPC was Mw 2,000 in terms of polystyrene.

Synthetic Example 9

Into a 300 ml flask, 7.5 g of tetramethoxysilane, 1.5 g of methyltrimethoxysilane, 2.5 g of (4-methoxyphenyl)trimethoxysilane, and 19.5 g of acetone were charged and the mixed solution was stirred with a magnetic stirrer while 2.7 g of 0.01 mol/1 hydrochloric acid was added dropwise to the mixed solution. After the addition, the flask was transferred in an oil bath heated at 85° C. and the mixture was heated under reflux and allowed to react for 240 minutes. The reaction solution was then cooled to room temperature and 26 g of propylene glycol monomethyl ether acetate was added to the reaction solution. Methanol, which was a byproduct, acetone, water, and hydrochloric acid were distilled off under reduced pressure, and the solution was concentrated to obtain a solution of the hydrolysis condensate (polymer) in propylene glycol monomethyl ether acetate. Propylene glycol monoethyl ether was added such that the ratio of propylene glycol monomethyl ether acetate/propylene glycol monoethyl ether was 20/80 and the solution was adjusted to be at 20% by mass in terms of solid residual at 140° C. The obtained polymer corresponds to formula (2-1) and the molar ratio of the unit structure derived from tetramethoxysilane, the unit structure derived from methyltrimethoxysilane, and the unit structure derived from (4-methoxyphenyl)trimethoxysilane was 70:20:10 in the polysiloxane. The weight-average molecular weight as measured by GPC was Mw 1,500 in terms of polystyrene.

Synthetic Example 10

Into a 300 ml flask, 7.5 g of tetramethoxysilane, 1.5 g of methyltrimethoxysilane, 2.5 g of pentafluorophenyltriethoxysilane, and 19.5 g of acetone were charged and the mixed solution was stirred with a magnetic stirrer while 2.7 g of 0.01 mol/1 hydrochloric acid was added dropwise to the mixed solution. After the addition, the flask was transferred in an oil bath heated at 85° C. and the mixture was heated under reflux and allowed to react for 240 minutes. The reaction solution was then cooled to room temperature and 26 g of propylene glycol monomethyl ether acetate was added to the reaction solution. Methanol and ethanol, which were byproducts, acetone, water, and hydrochloric acid were distilled off under reduced pressure, and the solution was concentrated to obtain a solution of the hydrolysis condensate (polymer) in propylene glycol monomethyl ether acetate. Propylene glycol monoethyl ether was added such that the ratio of propylene glycol monomethyl ether acetate/propylene glycol monoethyl ether was 20/80 and the solution was adjusted to be at 20% by mass in terms of solid residual at 140° C. The obtained polymer corresponds to formula (2-5) and the molar ratio of the unit structure derived from tetramethoxysilane, the unit structure derived from methyltrimethoxysilane, and the unit structure derived from pentafluorophenyltriethoxysilane was 70:20:10 in the polysiloxane. The weight-average molecular weight as measured by GPC was Mw 1,500 in terms of polystyrene.

Comparative Synthetic Example 1

Into a 300 ml flask, 18.60 g of tetramethoxysilane, 3.48 g of methyltrimethoxysilane, 1.41 g of phenyltrimethoxysilane, and 35.55 g of acetone were charged and the mixed solution was stirred with a magnetic stirrer while 5.21 g of 0.01 mol/1 hydrochloric acid was added dropwise to the mixed solution. After the addition, the flask was transferred in an oil bath heated at 85° C. and the mixture was heated under reflux and allowed to react for 240 minutes. The reaction solution was then cooled to room temperature and 48.00 g of propylene glycol monomethyl ether acetate was added to the reaction solution. Methanol, which was a byproduct, acetone, water, and hydrochloric acid were distilled off under reduced pressure, and the solution was concentrated to obtain a solution of the hydrolysis condensate (polymer) in propylene glycol monomethyl ether acetate. Propylene glycol monoethyl ether was added such that the ratio of propylene glycol monomethyl ether acetate/propylene glycol monoethyl ether was 20/80 and the solution was adjusted to be at 20% by mass in terms of solid residual at 140° C. The obtained polymer corresponds to formula (3-1) and the molar ratio of the unit structure derived from tetramethoxysilane, the unit structure derived from methyltrimethoxysilane, and the unit structure derived from phenyltrimethoxysilane was 70:25:5 in the polysiloxane. The weight-average molecular weight as measured by GPC was Mw 2,000 in terms of polystyrene.

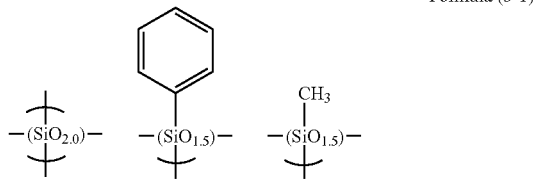

Formula (3-1)

Comparative Synthetic Example 2

Into a 300 ml flask, 7.5 g of tetraethoxysilane, 1.5 g of methyltrimethoxysilane, 1.2 g of phenyltrimethoxysilane, and 35.55 g of acetone were charged and the mixed solution was stirred with a magnetic stirrer while 5.21 g of 0.01 mol/l hydrochloric acid was added dropwise to the mixed solution. After the addition, the flask was transferred in an oil bath heated at 85° C. and the mixture was heated under reflux and allowed to react for 240 minutes. The reaction solution was then cooled to room temperature and 48.00 g of propylene glycol monomethyl ether acetate was added to the reaction solution. Methanol, which was a byproduct, acetone, water, and hydrochloric acid were distilled off under reduced pressure, and the solution was concentrated to obtain a solution of the hydrolysis condensate (polymer) in propylene glycol monomethyl ether acetate. Propylene glycol monoethyl ether was added such that the ratio of propylene glycol monomethyl ether acetate/propylene glycol monoethyl ether was 20/80 and the solution was adjusted to be at 20% by mass in terms of solid residual at 140° C. The obtained polymer corresponds to formula (3-1) and the molar ratio of the unit structure derived from tetraethoxysilane, the unit structure derived from methyltrimethoxysilane, and the unit structure derived from phenyltrimethoxysilane was 70:25:5 in the polysiloxane. The weight-average molecular weight as measured by GPC was Mw 1,500 in terms of polystyrene.

(Organic Underlayer Film (Layer A))

CNp-PM (the molar ratio of the components, vinylnaphthalene 60%: polyhydroxystyrene 40%, weight-average molecular weight: 6,000) manufactured by Maruzen Petrochemical Co., Ltd was used as an organic underlayer film (layer A).

The evaluation results of the films formed from the film forming composition of the present invention and used as resist underlayer films are shown below.

The polymer solutions prepared in Synthetic Examples 1 to 10 and Comparative Synthetic Examples 1 and 2 were adjusted to be at a solid content of 20% by mass and used as resist underlayer film forming compositions of Examples 1 to 10 and Comparative Examples 1 and 2, respectively.

(Preparation of Resist Underlayer Films)

The silicon-containing polymers obtained in Synthetic Examples 1 to 10 and Comparative Synthetic Examples 1 and 2, an acid, curing catalysts, an additive, solvents, and water were mixed in proportions shown in Table 1 and filtered through a 0.1 μm fluororesin filter to prepare solutions of the composition for forming the resist underlayer film. The addition amount of the polymer in Table 1 refers to the amount of the polymer, not the polymer solution. In Table 1, the following abbreviations are used: maleic acid is MA, benzyltriethylammonium chloride is BTAC, N-(3-triethoxysilylpropyl)-4,5-dihydroimidazole is IMIDTEOS, bis (4-hydroxyphenyl) sulfone is BPS, propylene glycol monomethyl ether acetate is PGMEA, propylene glycol monoethyl ether is PGEE, propylene glycol monomethyl ether is PGME, and ethyl lactate is EL. Ultrapure water was used as water. The addition amounts are expressed in parts by mass.

TABLE 1

| | Polymer | Acid | Curing catalyst | Additive | Solvent | | | Water |
|---|---|---|---|---|---|---|---|---|
| Example 1 | Synthetic example 1 | MA | BTAC | BPS | PGME | PGEE | PGMEA | Water |
| (parts by mass) | 2 | 0.02 | 0.012 | 0.1 | 10 | 80 | 13 | 7 |
| Example 2 | Synthetic example 2 | MA | BTAC | BPS | PGME | PGEE | PGMEA | Water |
| (parts by mass) | 2 | 0.02 | 0.012 | 0.1 | 10 | 80 | 13 | 7 |
| Example 3 | Synthetic example 3 | MA | BTAC | BPS | PGME | PGEE | PGMEA | Water |
| (parts by mass) | 2 | 0.02 | 0.012 | 0.1 | 10 | 80 | 13 | 7 |
| Example 4 | Synthetic example 4 | MA | BTAC | BPS | PGME | PGEE | PGMEA | Water |
| (parts by mass) | 2 | 0.02 | 0.012 | 0.1 | 10 | 80 | 13 | 7 |
| Example 5 | Synthetic example 5 | MA | BTAC | BPS | PGME | PGEE | PGMEA | Water |
| (parts by mass) | 2 | 0.02 | 0.012 | 0.1 | 10 | 80 | 13 | 7 |
| Example 6 | Synthetic example 6 | MA | BTAC | BPS | PGME | PGEE | PGMEA | Water |
| (parts by mass) | 2 | 0.02 | 0.006 | 0.1 | 10 | 80 | 13 | 7 |
| Example 7 | Synthetic example 7 | MA | BTAC | BPS | PGME | PGEE | PGMEA | Water |
| (parts by mass) | 2 | 0.02 | 0.012 | 0.1 | 10 | 80 | 13 | 7 |
| Example 8 | Synthetic example 8 | MA | IMIDTEOS | BPS | PGME | PGEE | PGMEA | Water |
| (parts by mass) | 2 | 0.02 | 0.012 | 0.1 | 10 | 80 | 13 | 7 |

TABLE 1-continued

| | Polymer | Acid | Curing catalyst | Additive | Solvent | | | Water |
|---|---|---|---|---|---|---|---|---|
| Example 9 | Synthetic example 9 | MA | BTAC | BPS | PGME | PGEE | PGMEA | Water |
| (parts by mass) | 2 | 0.02 | 0.012 | 0.1 | 10 | 80 | 13 | 7 |
| Example 10 | Synthetic example 10 | MA | BTAC | BPS | PGME | PGEE | PGMEA | Water |
| (parts by mass) | 2 | 0.02 | 0.012 | 0.1 | 10 | 80 | 13 | 7 |
| Comparative example 1 | Comparative synthetic example 1 | MA | BTAC | BPS | PGME | PGEE | PGMEA | Water |
| (parts by mass) | 2 | 0.02 | 0.012 | 0.1 | 10 | 80 | 13 | 7 |
| Comparative example 2 | Comparative synthetic example 2 | MA | BTAC | BPS | PGME | EL | | Water |
| (parts by mass) | 2 | 0.02 | 0.006 | 0.1 | 10 | 80 | | 7 |

The prepared solutions of the composition for forming the resist underlayer film were used for measurement of optical constants. The solutions were diluted to have a solid content of 1% by mass and used for resist pattern formation by EUV exposure and out gas measurement.

(Optical Constants Measurement)

Each of the resist underlayer film forming composition was applied on a silicon wafer with a spinner. The wafer was heated at 215° C. for 1 minute to form a resist underlayer film (film thickness 0.05 μm). The resist underlayer film was analyzed for refractive indices at wavelengths of 193 and 248 nm (n values) and optical absorption coefficients (k value, also called an attenuation factor) with a spectroscopic ellipsometer (manufactured by J.A. Woollam, VUV-VASE VU-302).

TABLE 2

| | n1 | k1 | n2 | k2 |
|---|---|---|---|---|
| Example 1 | 1.51 | 0.19 | 1.54 | 0.03 |
| Example 2 | 1.53 | 0.17 | 1.52 | 0.03 |
| Example 3 | 1.52 | 0.20 | 1.53 | 0.02 |
| Example 4 | 1.49 | 0.07 | 1.64 | 0.04 |
| Example 5 | 1.54 | 0.08 | 1.48 | 0.03 |
| Example 6 | 1.53 | 0.24 | 1.59 | 0.02 |
| Example 7 | 1.54 | 0.20 | 1.56 | 0.03 |
| Example 8 | 1.50 | 0.36 | 1.62 | 0.03 |
| Comparative example 1 | 1.61 | 0.17 | 1.52 | 0.03 |

[Formation of Resist Pattern by EUV Exposure]

The organic underlayer film (layer A) forming composition was applied on a silicon wafer and the wafer was baked at 215° C. for 60 seconds on a hot plate to obtain an organic underlayer film (layer A) with a film thickness of 90 nm. On the layer A, the resist underlayer film forming composition solution prepared in Examples 1 to 8 of the present invention and Comparative Example 1 are applied by spin coating and heated at 215° C. for 1 minute to form a resist underlayer film (B) layer (25 nm). On the layer (B), a resist solution for EUV (methacrylate resin-based resist) was applied by spin coating and heated to form an EUV resist layer (C) layer. The layer was exposed to EUV light by using an EUV exposure machine (Micro Exposure Tool, abbreviated as MET) under the condition of NA=0.30, σ=0.36/0.68, Quadropole. After the exposure, PEB (post exposure bake, 90° C.) was performed and cooled on a cooling plate to room temperature, followed by development and rinsing to form a resist pattern. The resist pattern was evaluated according to the following criteria: a 26 nm line-and-space pattern was formed or not and the pattern shape was good or not as determined by the observation of the section of the pattern.

TABLE 3

| | Pattern formation | Pattern shape | Exposure needed for pattern formation (mJ/cm$^2$) |
|---|---|---|---|
| Example 1 | Acceptable | Good | 10.58 |
| Example 2 | Acceptable | Good | 11.00 |
| Example 3 | Acceptable | Good | 10.58 |
| Example 4 | Acceptable | Good | 11.00 |
| Example 5 | Acceptable | Good | 11.00 |
| Example 6 | Acceptable | Good | 11.00 |
| Example 7 | Acceptable | Good | 11.00 |
| Example 8 | Acceptable | Good | 10.01 |
| Comparative example 1 | Acceptable | Good | 11.04 |

[The Amount of Out Gases Generated]

The resist underlayer film forming composition solutions prepared in Examples 9 and 10 and Comparative Example 2 were applied on silicon wafers with a spinner. The wafers were heated at 205° C. for 1 minute on a hot plate to form resist underlayer films (film thickness 0.03 μm).

These resist underlayer films were analyzed for the amount of out gases by using a Resist Outgassing Exposure (ROX) system. The resist underlayer films were exposed to EUV with the pressure inside the chamber being in a range of 1.0 to 8.0×10$^{-8}$ and the exposure being 6.0 mJ/cm$^2$ and the amounts of out gases generated were measured by a Quadropole MS. The out gases were measured in a molecular range of 35 to 200 excluding molecular weight of 44.

The results of the amounts of out gases generated are shown in Table 4. The unit is number of molecule/cm$^2$/s.

TABLE 4

| | Amount of out gases generated |
|---|---|
| Example 9 | 2.90 × 10$^{13}$ |
| Example 10 | 2.23 × 10$^{13}$ |
| Comparative example 2 | 1.38 × 10$^{14}$ |

Examples 9 and 10 according to Synthetic Examples 9 and 10 obtained from the silane compounds having exclusively methoxy groups as hydrolyzable groups generated less amounts of out gases than Comparative Example 2 according to Comparative Synthetic Example 2 obtained from the silane compounds containing tetraethoxysilane having ethoxy groups as hydrolyzable groups in a large proportion.

In Example 9, the molar ratio of methoxy group:ethoxy group as hydrolyzable groups in all the silanes is 100:0.

In Example 10, the molar ratio of methoxy group:ethoxy group as hydrolyzable groups in all the silanes is 34:3.

In Comparative Example 2, the molar ratio of methoxy group:ethoxy group as hydrolyzable groups in all the silanes is 28:9.

It was found that the silanes having methoxy groups and ethoxy groups in a molar ratio of 100:0 to 80:20 generate a small amount of out gases.

INDUSTRIAL APPLICABILITY

The present invention provides a resist underlayer film forming composition for EUV lithography that allows microprocessing of a substrate by using a rectangular resist pattern and that can be used in the manufacture of semiconductor devices. The present invention provides a resist underlayer film for lithography that improves the exposure sensitivity of an EUV resist, causes no intermixing with a resist, has a high dry etching rate compared with the resist, and generates a small amount of out gases when exposed to EUV light.

The invention claimed is:

1. A resist underlayer film forming composition for EUV lithography, comprising:
   as a silane, a hydrolyzable silane, a hydrolyzate of the hydrolyzable silane, a hydrolysis condensate of the hydrolyzable silane, or a mixture of any of the hydrolyzable silane, the hydrolyzate, and the hydrolysis condensate, wherein
   the hydrolyzable silane consisting of a combination of tetramethoxysilane, an alkyltrimethoxysilane, and an aryltrialkoxysilane,
   the aryltrialkoxysilane is represented by formula (1):

  Formula (1)

(in formula (1), $R^1$ is an aromatic ring consisting of a benzene ring or a naphthalene ring or a ring including an isocyanuric acid structure, $R^2$ is a substituent replacing a hydrogen atom on the aromatic ring and is a halogen atom or a $C_{1-10}$ alkoxy group, and X is a $C_{1-10}$ alkoxy group, a $C_{2-10}$ acyloxy group, or a halogen group; and n1 is an integer of 0 or 1, and n2 is an integer of 1 to 5 for the benzene ring or an integer of 1 to 9 for the naphthalene ring), and
   the hydrolyzable silane includes 10 to 35 mol of the alkyltrimethoxysilane and 2 to 25 mol of the aryltrialkoxysilane relative to 70 mol of tetramethoxysilane.

2. The resist underlayer film forming composition according to claim 1, wherein
   $R^1$ in formula (1) is a benzene ring.

3. The resist underlayer film forming composition according to claim 1, wherein
   $R^2$ in formula (1) is a methoxy group, a methoxymethoxy group, a fluorine atom, a chlorine atom, or a bromine atom.

4. The resist underlayer film forming composition according to claim 1, wherein
   X in formula (1) is a methoxy group.

5. The resist underlayer film forming composition according to claim 1, wherein
   n1 in formula (1) is 0.

6. The resist underlayer film forming composition according to claim 1, wherein
   the alkyltrimethoxysilane is methyltrimethoxysilane.

7. The resist underlayer film forming composition according to claim 1, wherein
   the silane includes a methoxy group and an ethoxy group as a hydrolyzable group in a ratio (molar ratio) of methoxy group: ethoxy group =100:0 to 80:20 in the whole silane.

8. The resist underlayer film forming composition according to claim 1, further comprising:
   an acid.

9. The resist underlayer film forming composition according to claim 1, further comprising:
   water.

10. The resist underlayer film forming composition according to claim 1, further comprising:
    an ammonium compound, a cyclic ammonium compound, a cyclic amine compound, or an onium compound.

11. A resist underlayer film obtained by:
    applying the resist underlayer film forming composition as claimed in claim 1 onto a semiconductor substrate and baking the resist underlayer film forming composition.

12. A method for manufacturing a semiconductor device, the method comprising:
    applying a resist underlayer film forming composition onto a semiconductor substrate and baking the resist underlayer film forming composition to form a resist underlayer film, wherein the resist underlayer film forming composition comprises:
    as a silane, a hydrolyzable silane, a hydrolyzate of the hydrolyzable silane, a hydrolysis condensate of the hydrolyzable silane, or a mixture of any of the hydrolyzable silane, the hydrolyzate and the hydrolysis condensate, wherein
    the hydrolyzable silane includes a combination of tetramethoxysilane, an alkyltrimethoxysilane, and an aryltrialkoxysilane, and
    the aryltrialkoxysilane is represented by formula (1):

  Formula (1)

(in formula (1), $R^1$ is an aromatic ring consisting of a benzene ring or a naphthalene ring or a ring including an isocyanuric acid structure, $R^2$ is a substituent replacing a hydrogen atom on the aromatic ring and is a halogen atom or a $C_{1-10}$ alkoxy group, and X is a $C_{1-10}$ alkoxy group, a $C_{2-10}$ acyloxy group, or a halogen group; and n1 is an integer of 0 or 1, and n2 is an integer of 1 to 5 for the benzene ring or an integer of 1 to 9 for the naphthalene ring);
    applying a resist composition onto the resist underlayer film to form a resist film;
    exposing the resist film to light, wherein the light is EUV light (13.5 nm);
    developing the resist film after the exposing to obtain a resist pattern;
    etching the resist underlayer film through the resist pattern; and
    processing the semiconductor substrate through the resist film thus patterned and the resist underlayer film thus patterned.

13. A method for manufacturing a semiconductor device, the method comprising:
    forming an organic underlayer film on a semiconductor substrate;
    applying a resist underlayer film forming composition onto the organic underlayer film and baking the resist underlayer film forming composition to form a resist underlayer film, wherein the resist underlayer film forming composition comprises:
    as a silane, a hydrolyzable silane, a hydrolyzate of the hydrolyzable silane, hydrolysis condensate of the hydrolyzable silane, or a mixture of any of the hydrolyzable silane, the hydrolyzate, and the hydrolysis condensate, wherein the hydrolyzable silane includes a combination of tetramethoxysilane, an alkyltrimethoxysilane, and an aryltrialkoxysilane, and the aryltrialkoxysilane is represented by formula (1):

$$(R^2)_{n2}\text{—}R^1\text{—}(CH_2)_{n1}\text{—}Si(X)_3 \quad \text{Formula (1)}$$

(in formula (1), $R^1$ is an aromatic ring consisting of a benzene ring or a naphthalene ring or a ring including an isocyanuric acid structure, $R^2$ is a substituent replacing a hydrogen atom on the aromatic ring and is a halogen atom or a $C_{1-10}$ alkoxy group, and X is a $C_{1-10}$ alkoxy group, a $C_{2-10}$ acyloxy group, or a halogen group; and n1 is an integer of 0 or 1, and n2 is an integer of 1 to 5 for the benzene ring or an integer of 1 to 9 for the naphthalene ring);

applying a resist composition onto the resist underlayer film to form a resist film;

exposing the resist film to light, wherein the light is EUV light (13.5 nm);

developing the resist film after the exposing to obtain a resist pattern;

etching the resist underlayer film through the resist pattern;

etching the organic underlayer film through the resist underlayer film thus patterned; and processing the semiconductor substrate through the organic underlayer film thus patterned.

* * * * *